United States Patent
Salter et al.

(10) Patent No.: US 11,078,691 B2
(45) Date of Patent: Aug. 3, 2021

(54) DEPLOYABLE VEHICLE DOOR HANDLE

(71) Applicant: Ford Global Technologies, LLC, Dearborn, MI (US)

(72) Inventors: Stuart C. Salter, White Lake, MI (US); Paul Kenneth Dellock, Northville, MI (US); David Brian Glickman, Southfield, MI (US); Annette Lynn Huebner, White Lake, MI (US); Kosta Papanikolaou, Huntington Woods, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 598 days.

(21) Appl. No.: 16/018,374

(22) Filed: Jun. 26, 2018

(65) Prior Publication Data
US 2019/0390488 A1 Dec. 26, 2019

(51) Int. Cl.
*E05B 81/76* (2014.01)
*E05B 85/10* (2014.01)
(Continued)

(52) U.S. Cl.
CPC .......... *E05B 81/76* (2013.01); *B60R 25/2045* (2013.01); *B60R 25/23* (2013.01);
(Continued)

(58) Field of Classification Search
CPC ...... E05B 85/103; E05B 85/107; E05B 81/76; G07C 9/33; G07C 9/0069; G07C 9/00182;
(Continued)

(56) References Cited

U.S. PATENT DOCUMENTS

| 7,911,321 B2 | 3/2011 | Bingle et al. |
| 8,091,280 B2 | 1/2012 | Hanzel et al. |

(Continued)

FOREIGN PATENT DOCUMENTS

| CN | 202261842 U | 5/2012 |
| CN | 205086649 U | 3/2016 |

(Continued)

OTHER PUBLICATIONS

"Touch Sensors Design Guide," by Atmel, 10620 D-AT42-04/09, Revised Apr. 2009, 72 pages, copyrighted 2008-2009 Atmel Corporation.

(Continued)

*Primary Examiner* — Kristina R Fulton
*Assistant Examiner* — Emily G. Brown
(74) *Attorney, Agent, or Firm* — David Coppiellie; Price Heneveld LLP

(57) ABSTRACT

A vehicle door handle is provided that includes a deployable handle body located on a door, keypad contacts on an outer side of the handle body, an actuator configured to deploy the handle to a deployed position, a plurality of proximity sensors located on the handle body and generating activation fields, and a controller processing signals generated by the sensors to determine an input command for controlling the actuator and to determine a keypad input. The controller may sense ice on the handle and determine ice thickness and may control the actuator to break the ice based on the ice thickness.

14 Claims, 11 Drawing Sheets

(51) Int. Cl.
  *B60R 25/23* (2013.01)
  *B60R 25/20* (2013.01)
  *G07C 9/00* (2020.01)
  *H03K 17/96* (2006.01)
  *H03K 17/955* (2006.01)
  *B60R 25/24* (2013.01)

(52) U.S. Cl.
  CPC .......... *E05B 85/103* (2013.01); *E05B 85/107* (2013.01); *G07C 9/0069* (2013.01); *H03K 17/955* (2013.01); *H03K 17/9622* (2013.01); *B60R 25/24* (2013.01); *E05Y 2400/86* (2013.01); *E05Y 2900/531* (2013.01); *H03K 17/962* (2013.01); *H03K 2217/96* (2013.01)

(58) Field of Classification Search
  CPC ......... G07F 7/10; G06F 21/31; G06Q 20/347; B60R 25/2045; B60R 25/23; B60R 25/24; H03K 17/9622; E05Y 2900/531; E05Y 2400/86
  See application file for complete search history.

(56) References Cited

U.S. PATENT DOCUMENTS

| | | | |
|---|---|---|---|
| 8,471,822 B2 | 6/2013 | Lightenberg | |
| 8,701,353 B2 | 4/2014 | Patel et al. | |
| 8,922,340 B2 | 12/2014 | Salter et al. | |
| 9,137,856 B2 | 9/2015 | Thompson et al. | |
| 9,151,089 B2 | 10/2015 | Aerts et al. | |
| 9,346,470 B2 | 5/2016 | Mittermeier | |
| 9,423,895 B2 | 8/2016 | Adamson et al. | |
| 9,447,613 B2 | 9/2016 | Salter et al. | |
| 9,512,662 B1 | 12/2016 | Dudar et al. | |
| 9,637,088 B2 | 5/2017 | Ette et al. | |
| 9,646,436 B1 | 5/2017 | Campbell et al. | |
| 9,696,839 B1 | 7/2017 | Bingle et al. | |
| 9,745,778 B1 | 8/2017 | Bingle | |
| 10,124,767 B1 | 11/2018 | Salter et al. | |
| 10,378,254 B1 | 8/2019 | Salter et al. | |
| 10,378,265 B2 | 8/2019 | Watanabe | |
| 2003/0029210 A1 | 2/2003 | Budzynski et al. | |
| 2004/0124708 A1* | 7/2004 | Giehler | G07C 9/00182 307/10.5 |
| 2006/0071755 A1 | 4/2006 | Muller et al. | |
| 2007/0194878 A1 | 8/2007 | Touge et al. | |
| 2007/0296242 A1 | 12/2007 | Frommer et al. | |
| 2008/0061933 A1 | 3/2008 | Ieda et al. | |
| 2010/0007463 A1* | 1/2010 | Dingman | B60Q 1/2669 340/5.72 |
| 2011/0148575 A1 | 6/2011 | Sobecki et al. | |
| 2012/0119524 A1 | 5/2012 | Bingle et al. | |
| 2013/0033362 A1 | 2/2013 | Hourne | |
| 2013/0244577 A1 | 9/2013 | Cheikh | |
| 2014/0000165 A1 | 1/2014 | Patel et al. | |
| 2014/0000167 A1 | 1/2014 | Patel et al. | |
| 2014/0069015 A1 | 3/2014 | Salter et al. | |
| 2015/0315839 A1 | 11/2015 | Shigemoto et al. | |
| 2015/0325066 A1* | 11/2015 | Muller | E05B 81/04 340/5.61 |
| 2015/0330112 A1 | 11/2015 | Van Wiemeersch et al. | |
| 2015/0330117 A1 | 11/2015 | Van Wiemeersch et al. | |
| 2016/0251880 A1 | 9/2016 | Bingle et al. | |
| 2016/0333627 A1 | 11/2016 | Dudar et al. | |
| 2017/0016255 A1 | 1/2017 | Guibbert et al. | |
| 2017/0103592 A1 | 4/2017 | Buttolo et al. | |
| 2017/0194960 A1 | 7/2017 | Bextermoeller et al. | |
| 2017/0232932 A1 | 8/2017 | Nishidai et al. | |
| 2017/0260778 A1 | 9/2017 | Witte et al. | |
| 2018/0283843 A1 | 10/2018 | Adams et al. | |
| 2019/0299847 A1 | 10/2019 | Mori et al. | |
| 2020/0011096 A1 | 1/2020 | Leonardi et al. | |

FOREIGN PATENT DOCUMENTS

| | | | | |
|---|---|---|---|---|
| CN | 107575101 A | 1/2018 | | |
| DE | 102006019581 B4 | 11/2014 | | |
| DE | 102013013203 A1 | 2/2015 | | |
| DE | 102015014615 A1 * | 5/2016 | ............. | E05B 85/08 |
| FR | 3023865 A1 * | 1/2016 | ........... | E05B 85/103 |
| FR | 3051820 A1 * | 12/2017 | ............. | E05B 81/77 |
| JP | 2002242533 A | 8/2002 | | |
| JP | 2008063907 A | 3/2008 | | |
| JP | 4146601 B2 | 6/2008 | | |
| JP | 4161898 B2 | 8/2008 | | |
| JP | 2009079353 A | 4/2009 | | |
| JP | 5309515 B2 | 7/2013 | | |
| KR | 1020130094569 A | 8/2013 | | |
| WO | WO-2017070307 A1 * | 4/2017 | ............. | E05B 77/06 |

OTHER PUBLICATIONS

U.S. Appl. No. 15/882,191, filed Jan. 29, 2018, entitled "Vehicle Exterior Keypad Having Interior Lamp," 4 pages of filing receipt, 13 pages of patent application and 6 pages of drawings.
Tesla Model S—Cold Weather Performance, Published Nov. 22, 2013 on YouTube, https://www.youtube.com/watch?v=GS9uDJGi52A&feature=c4-overview&list=UU5WjFrtBdufl6CZojX3D8dQ, 3 pages.
How to—Range Rover Velar (2017) Vehicle Feature: Gesture Tailgate, Published Jul. 14, 2017 on YouTube, https://www.youtube.com/watch?v=RjhYd2b1ZIE, 1 page.

* cited by examiner

DEPLOYABLE VEHICLE DOOR HANDLE

FIELD OF THE INVENTION

The present invention generally relates to powered vehicle doors, and more particularly relates to a powered vehicle door having door control inputs sensed via proximity sensing.

BACKGROUND OF THE INVENTION

Automotive vehicles include various door assemblies for allowing access to the vehicle, such as passenger doors allowing access to the passenger compartment. The vehicle doors typically include a door handle and a latch assembly that latches the door in the closed position and is operable by a user to unlatch the door to allow the door to open. The doors may pivot or slide on a track between open and closed positions. Some vehicle doors are equipped with a motor to provide power door opening assist to open the door. Upon receiving a user input, the motor actuates the door to an open position or a closed position. Some vehicle doors further employ deployable handles. It is desirable to provide for vehicle door controls that provides enhanced functionality.

SUMMARY OF THE INVENTION

According to one aspect of the present invention a vehicle door handle is provided. The vehicle door handle includes a deployable handle body, an actuator configured to deploy the handle body to a deployed position, and at least one proximity sensor located on the handle body and generating activation fields, and a controller processing at least one signal generated by the sensor to determine an input command and controlling the actuator to deploy the handle based on the input command.

Embodiments of the first aspect of the invention can include any one or a combination of the following features:
  the at least one proximity sensor comprises a plurality of proximity sensors;
  the controller further determines a keypad input based on the signals generated by the sensors;
  the keypad input comprises a sequence of inputs sensed by the plurality of sensors used to deploy the handle body;
  the door handle includes a plurality of keypad contact surfaces on an outer side of the handle body;
  the controller further determines a swipe gesture command and closes or opens the door based on the swipe gesture command;
  the handle body has an inner side and an outer side, wherein the swipe gesture command is input on the outer side;
  the controller further determines a handle pull on the inner side of the handle body when the handle body is deployed and controls a door actuator to open the door in response to the handle pull;
  the plurality of proximity sensors comprises a plurality of capacitive sensors;
  the handle body is flushed mounted in a door in a stowed position and extends outward from the door to an extended deployed position; and
  the handle body pivots between the stowed and extended deployed positions.

According to another aspect of the present invention, a vehicle door handle is provided. The vehicle door handles includes a deployable handle body located on a door, keypad contacts on an outer side of the handle body, an actuator configured to deploy the handle to a deployed position, a plurality of proximity sensors located on the handle body and generating activation fields, and a controller processing signals generated by the sensors to determine an input command for controlling the actuator and to determine a keypad input.

Embodiments of the second aspect of the invention can include any one or a combination of the following features:
  the controller further determines the keypad input based on the signals generated by the plurality of proximity sensors;
  the keypad input comprises a sequence of inputs sensed by the plurality of sensors used to deploy the handle body;
  the controller further determines a swipe gesture command and closes or opens the door based on the swipe gesture;
  the handle body has an inner side and an outer side, wherein the keypad input is entered on the outer side;
  the controller further determines a handle pull on the inner side of the handle body when the handle body is deployed and controls a door actuator to open the door in response to the handle pull;
  the plurality of proximity sensors comprises a plurality of capacitive sensors;
  the handle body is flushed mounted in the door in a stowed position and extends outward from the door to an extended deployed position; and the handle body pivots between the stowed and extended deployed positions.

These and other aspects, objects, and features of the present invention will be understood and appreciated by those skilled in the art upon studying the following specification, claims, and appended drawings.

DETAILED DESCRIPTION OF THE PREFERRED EMBODIMENTS

Figure 1:
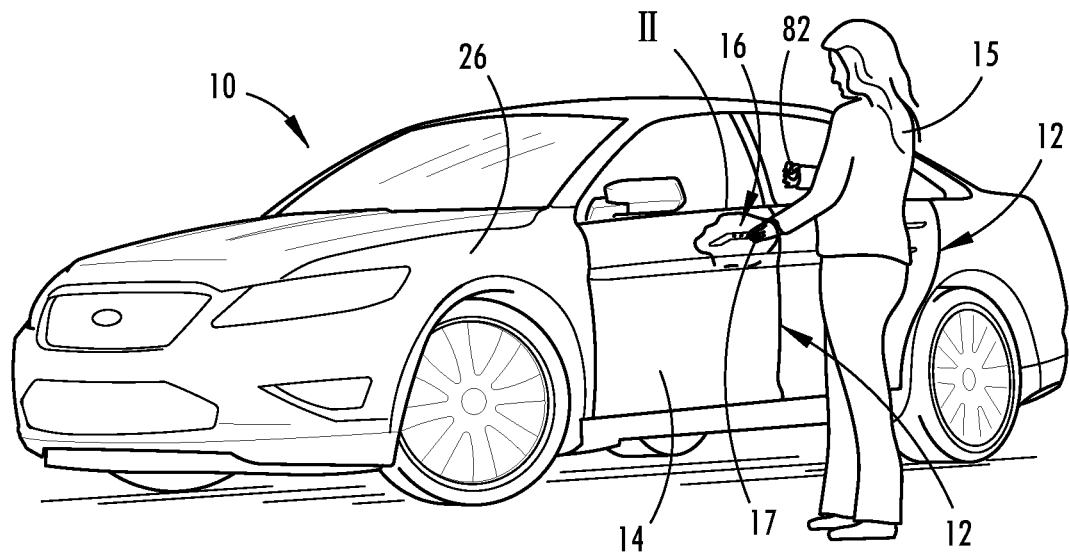
FIG. 1 is a side perspective view of a motor vehicle having doors equipped with deployable door handles having proximity sensed input controls, according to one embodiment.

For purposes of description herein, the terms "upper," "lower," "right," "left," "rear," "front," "vertical," "horizontal," "interior," "exterior" and derivatives thereof shall relate to the invention as oriented in FIG. 1. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 2:
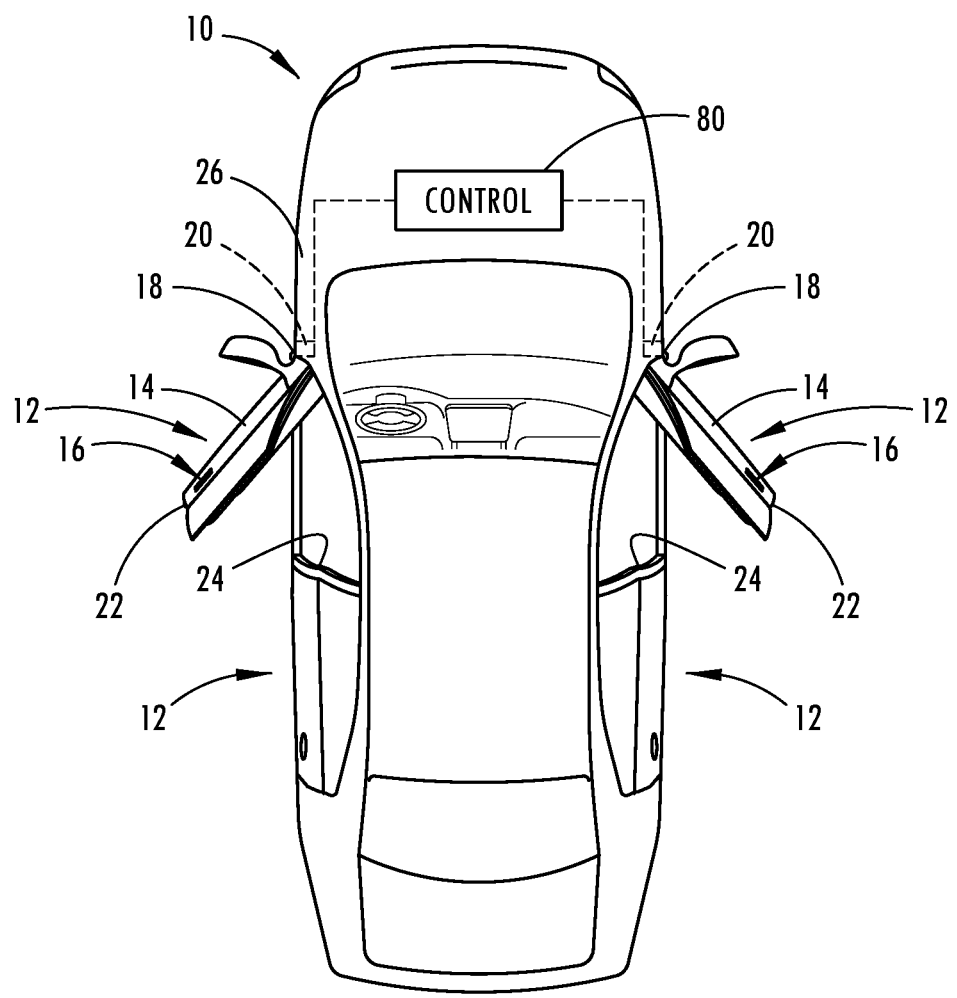
FIG. 2 is a top view of the vehicle further illustrating the two forwardmost powered doors in the open position.

Referring now to FIGS. 1 and 2, a wheeled motor vehicle 10 is generally illustrated having a plurality of variable-speed powered doors equipped with deployable door handles having proximity sensor based controls, according to one embodiment. The vehicle 10 includes vehicle doors 16 provided on opposite sides of the vehicle 10. In the embodiment shown, the vehicle 10 has a front door and a rear door on a first or driver's side of the vehicle 10 to enable the driver and passengers to enter and exit the seating compartment from the first side, and a front door and a rear door on the opposite second or passenger's side of the vehicle 10 to enable passengers to access the seating compartment from the second side. The vehicle doors 12 each include a door panel 14 pivotally connected to a frame or body 26 of the vehicle 10. The connection between each door panel 14 and body 26 may include one or more hinge assemblies 18 that allow the door 12 to swing about the hinge assembly 18 between the closed and open positions. While the doors 12 are pivoting doors in the embodiment shown, it should be appreciate that one or more of the doors 12 could otherwise move between open and closed positions, such as sliding doors.

Each door 12 also includes a deployable door handle 16 located on the exterior side of the door panel 14. The door handle 16 has a deployable handle body shown and described herein as a flush mounted handle body in the stowed position that pivots and extends outward to a deployed position so that a user may grip or interface with the handle 16. The door handle 16 has a first contact surface on a first or inner side to enable a user to contact the door handle 16 when in the deployed position to input door control commands that may include a door open command, a door closing command and door opening speed commands. The door handle 16 has a second contact surface, shown with five keypad contacts on a second or outer side to enable a user to input door handle commands such as keypad inputs to deploy the handle body and input gesture commands such as a swipe command to open or close the door. It should be appreciated that the door handle 16 may have other shapes, sizes and configurations.

The door handle 16 has a handle actuator configured to deploy the handle body outward to the outward extending deployed position and back inward to the stowed position. The handle actuator may include an electric motor located within the door 12 that may directly drive or may drive via a worm gear and wheel the handle body between the extended and stowed positions. The door handle actuator may actuate the handle 16 based on user inputs such as a keypad input.

The door 12 includes a door actuator such as an electric motor 20 shown located near the hinge assembly 18. The motor 20 is actuatable in a first direction to open the door to an open position. The motor 20 may also be actuatable in the reverse second direction to close the door to a closed position. The door actuator may operate at multiple speeds in response to a sensed user hand contacting the first contact surface on the inner side of the handle to input a door speed control command or a user inputting a swipe gesture command proximate the second contact surface on the outer side of the handle. For example, the door panel 14 may be opened at a first slow speed, or a second middle or normal speed which is faster than the first speed, or a fast third speed which is faster than the second speed, depending on the amount of contact area sensed on the first contact surface of the door handle or speed of a swipe gesture proximate the second contact surface as sensed by a proximity sensor arrangement. The activation may also close the door at one or more speeds.

The vehicle door 12 may further include a door latch assembly 22 configured to engage a latch mechanism 24 on the vehicle body 26 when the door panel 14 is in the closed position. The door latch assembly 22 may be electronically controlled to latch and unlatch the door 12 based on a user input as sensed by the proximity sensor arrangement. For example, the latch assembly 22 may unlatch when either a user's hand is detected or sensed contacting the first contact surface on the inner side of the deployed door handle 16 or a swipe gesture command is detected on the second contact surface on the outer surface of the stowed door handle 16, and a vehicle key fob 82 (FIG. 3) or other electronic device such as a smartphone is sensed in close proximity (e.g., within one meter) to the corresponding vehicle door 12. When the door is closed, the latch assembly 22 will latch onto the latch mechanism 24 on the vehicle body 26 to keep the door 12 latched in the closed position. It should be appreciated that various latch configurations may be used. It should also be appreciated that the door latch assembly 22 may otherwise be controlled with a key fob or with user input controls provided on the vehicle 10.

Figure 3:
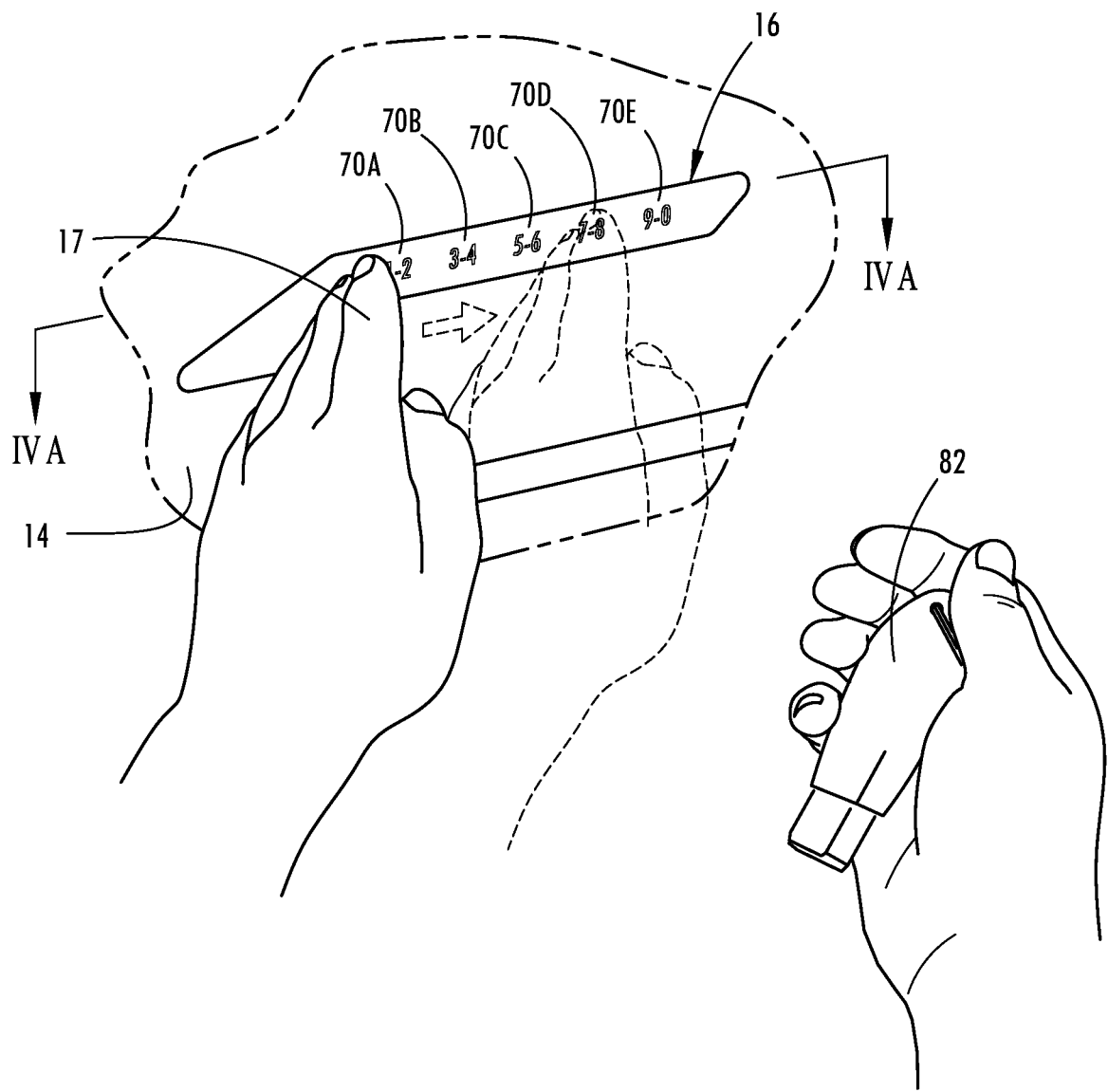
FIG. 3 is an enlarged view of section II of FIG. 1 further illustrating the deployable vehicle door handle in the flush retracted stowed position and a hand gesture input command.
Figure 4A:
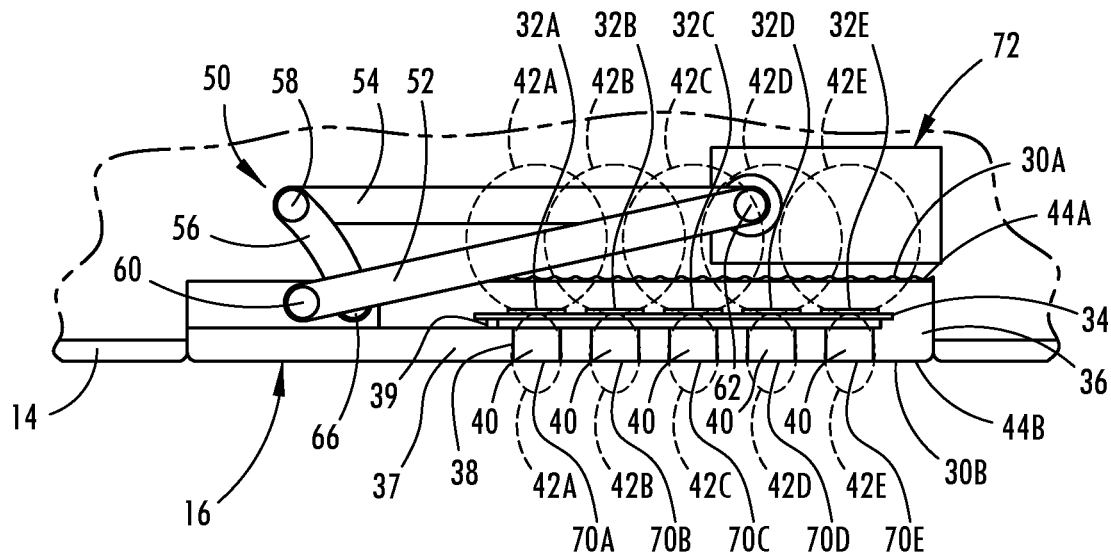
FIG. 4A is a schematic top cut away view of the deployable door handle shown in the flush retracted stowed position and employing a direct drive motor assembly, according to one embodiment.
Figure 4B:
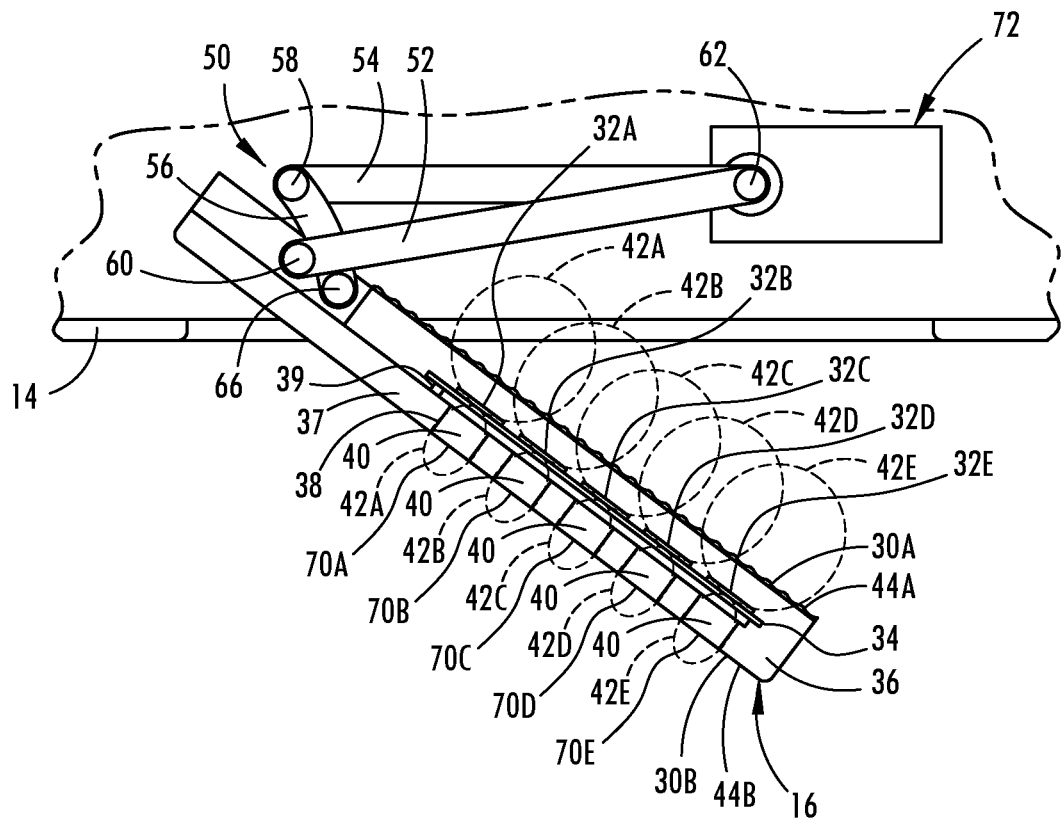
FIG. 4B is a schematic top cut away view of the deployable door handle of FIG. 4A shown in the extended position.

Referring to FIGS. 3-4B, the door 12 and the door handle 16 are further illustrated in greater detail in both a flush stowed position and an outward extended deployed position. The door handle 16 is shown located on the exterior surface of the door panel 14 and is flush mounted within the door panel 14 when in the flush stowed position as shown in FIGS. 3 and 4A. A user may input a gesture swipe command via the user's hand 17 by swiping across capacitive sensors arranged in the handle body from left to right to open the door or from right to left to close the door, for example. This gesture swipe command may occur with the handle body in the stowed position or in the extended position. A handle motor 72 may be activated to pivot the handle 16 from the flush stowed position shown in FIG. 4A to the outward extended deployed position shown in FIG. 4B in which the vehicle rearward portion of the handle 16 extends outward from the vehicle door. The handle 16 has a handle body 36 configured with a first or inner side 44A and a second or outer side 44B which is exposed to a user positioned outside of the vehicle 10. The outer side 44B of the handle 16 includes a plurality of keypad inputs 70A-70E, which enable a user to sequentially enter keypad inputs to deploy the handle 16 and to unlock and lock the door. Thus, when the handle 16 is in the flush stowed position, the user may enter a sequence of codes on the keypad to deploy the handle 16 and to unlock or lock the door latch assembly 22 on the door 12. The keypad inputs 70A-70E may be positioned on a flush surface or may have contoured touch pads.

Referring to FIGS. 4A and 4B, the door handle 16 is generally shown as a deployable handle that may deploy from the flush stowed position shown in FIG. 4A to an extended deployed position shown in FIG. 4B in which the handle 16 is pivoted outward to enable a user to grip the handle 16 on the inner side 44A to enable the user to apply a handle pull force and input a door command signal to unlatch the door 12, actuate the door to the open position at a select speed, and to actuate the door to the closed position. The deployable door handle 16 pivots about a hinge assembly 50. The hinge assembly 50 may be configured to provide an over center pivoting rotation of the door handle 16. When the handle motor 72 is activated for extending the handle, the hinge assembly 50 pivots the vehicle rearward portion of the handle 16 outward to the deployed position extending outward at an angle in the range of fifteen degrees to sixty degrees (15°-60°.

The hinge assembly 50 includes a first rod 52 pivotally connected on one end to one end of a second rod 54 via a first pivot pin 62. The opposite end of the first rod 52 is connected to a second pivot pin 60. The opposite end of the second rod 54 is connected to a third rod 56 via a third pivot pin 58. The opposite end of the third rod 56 is connected to a fourth pivot pin 66. The handle motor 70 is illustrated as a direct drive motor in FIGS. 4A and 4B for actuating the door handle between stowed and extended deployed positions, according to one embodiment. In this embodiment, the handle motor 72 is connected to the first pivot pin 62 which connects to rods 52 and 54. The motor 72 may push on rod 52 to cause the handle body 36 to pivot towards the stowed position and may pull on rod 62 to cause the handle body 36 to move towards the extended position.

Figure 4C:
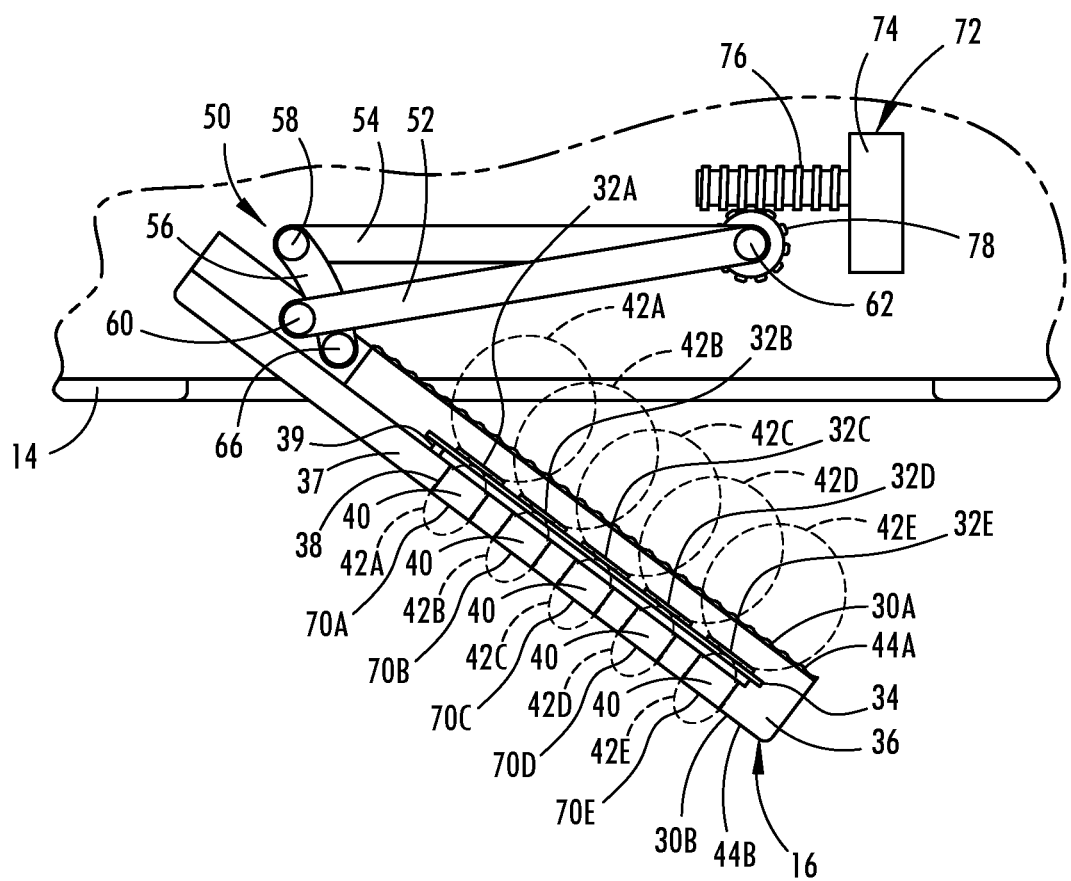
FIG. 4C is a schematic top cut away view of the deployable door handle in the extended position and employing a worm gear and motor assembly, according to another embodiment.

According to another embodiment shown in FIG. 4C, the handle motor 72 may be configured with a worm gear 76 that engages a wheel 78 that, in turn, is connected to the first pivot pin 62. As such, the motor 72 rotates the worm gear 76 to turn wheel 78 to move rod 52 forward and backward to cause the handle body 36 to move between the stowed and extended positions. It should further be appreciated that the handle 16 may otherwise be configured with an actuator to move between the stowed and extended positions. Further, the handle may be manually activated to the extended position by a user applying inward force on the leftmost end of the handle body.

The door handle 16 includes a proximity sensor arrangement 32 located on the door handle body 36 and configured to sense a user's hand interfacing with the door handle 16 both on the first contact surface 30A on the inner side 44A of the door handle 16 and on the second contact surface 30B on the outer side of the door handle 16. The proximity sensor arrangement 32 has one or more proximity sensors configured to sense a user in close proximity, e.g., within one millimeter, or in contact with the first contact surface 30A on the inner side 44A of the door handle 16 and on the second contact surface 30B on the outer side 44B of the door handle 16. In the embodiment shown, the proximity sensor arrangement 32 includes five proximity sensors 32A-32E shown evenly spaced along a length of the handle body 36 of the door handle 16 for generating corresponding sense activation fields 42A-42E. The sense activation fields 42A-42E operate as sensing fields and are shown extending on the inner side 44A of the handle 16 and overlapping with one another and sufficiently covering the first contact surface 30A and further extending on the outer side 44B of the handle 16 in narrow fields that do not overlap with each other and cover the second contact surface 30B which has keypad contact surfaces for five individual keypads. Each of the proximity sensors 32A-32E generates a sense activation field 42A-42E and generates a signal in response to sensed interference with the corresponding sense activation field. The signal generated with each proximity sensor 32A-32E is processed by a controller to detect the presence of a user e.g., hand or one or more fingers of a user, within the sense activation field and generates a signal amplitude dependent upon the amount of interference or contact with the contact surface 30 on the inner side 44A or the outer side 44B within the sense activation field. For example, when a user's hand or finger lightly touches the inner side 44A of the door handle 16, a relatively smaller amplitude signal is generated, whereas if the user's hand pulls on the inner side 44A of the door handle 16 on the contact surface 30, the amount of signal amplitude generated by each sensor is greater.

The proximity sensors 32A-32E are located within a housing of the handle body 36 of door handle 16 in close proximity to the first contact surface 30A. The door handle 16, particularly the first contact surface 30 on the inner side 44A, is preferably made of a material, such as polymeric material, that does not interfere with the sense activation fields 42A-42E. The inner side 44B of the handle may have a roughened surface or gripping pattern for enhanced gripping. Each of the proximity sensors 32A-32E is located on a printed circuit board 34 which may include other electrical circuitry. The printed circuit board 34 includes a controller or control circuitry which may include a microprocessor which may be electrically connected to the proximity sensors 32A-32E and may process the signal generated by each of the sensors 30A-32E. It should be appreciated that each of the proximity sensors 32A-32E are located on one side of the printed circuit board 34 facing towards the first contact surface 30A on the inner side 44A of the door handle 16. A ground layer 37 is disposed on the opposite side of the printed circuit board 34 and thus is located on the side of the circuit board 34 generally facing towards the outer side 44B of the door handle 16. The ground layer 37 is made of an electrically conductive material that is grounded to an electrical ground. The ground layer 37 provides a beam shaping shield located between the sensors 32A-32E and the outer side 44B to generate a narrower sensing field on the outer side 44B of the handle body 36 for each sensor. The ground layer 37 has holes that allow a portion of the sense activation fields to extend therethrough to the outer side 44B and prevents a portion of the sense activation fields 42A-42E generated by each of the sensors 32A-32E from extending towards the outer side 44B of the door handle 16 while allowing the sense activation fields 42A-42E to extend towards the inner side 44A of the door handle 16 where the first contact surface 30A is located.

In the embodiment shown, the plurality of proximity sensors 32A-32E includes a linear array of five sensors, however, it should be appreciated that one or more proximity sensors may be employed in the array of proximity sensors. Additionally, it should be appreciated that the array of proximity sensors 32A-32E is configured to sense the proximity of objects located at or near the first contact surface 30A on the inner side 44A of the door handle 16 and on the outer side of the door handle 16 at or near the second contact surface 30B, according to one embodiment. However, it should be appreciated that the array of proximity sensors 32A-32E may be provided on a different side of the door handle 16, according to other embodiments. It should further be appreciated that the powered door 12 may be implemented on any side door of the vehicle 10 or another door of the vehicle, such as a vehicle tailgate or an interior door handle according to other embodiments.

The proximity sensors 32A-32E are shown and described herein as capacitive sensors, according to one embodiment. Each capacitive sensor includes at least one capacitive sensor that provides a sense activation field 42A-42E used as a sensing field to sense contact or close proximity (e.g., within one millimeter) of an object, such as the hand (e.g., palm and/or fingers) of a user or operator in relation to the one or more proximity sensors 32A-32E. The capacitive sensors may operate as a capacitive switch that may deploy the handle and may unlatch the door latch and may operate as a switch input to control the variable-speed of the door motor for opening the door and closing the door and may be used to detect keypad inputs and may detect gesture inputs. In this embodiment, the sense activation field of each proximity sensor is a capacitive field and the user's hand, including the palm, thumb and other fingers, has electrical conductivity and dielectric properties that cause a change or disturbance in the sense activation field as should be evident to those skilled in the art. However, it should be appreciated by those skilled in the art that additional or alternative types of proximity sensors can be used, such as, but not limited to inductive sensors, optical sensors, temperature sensors, resistive sensors, the like or a combination thereof. Exemplary proximity sensors are described in the Apr. 9, 2009, ATMEL® Touch Sensors Design Guide, 10620 D-AT42-04/09, the entire reference hereby being incorporated herein by reference.

Each of the capacitive sensors may be configured with electrical circuitry that may be printed with conductive ink on a substrate and generally includes a drive electrode and a receive electrode, each having interdigitated fingers for generating a capacitive field, according to one embodiment. It should be appreciated that each of the proximity sensors 32A-32E may otherwise be formed. Each capacitive sensor may have a drive electrode that typically receives a square wave drive pulse applied at a voltage and a receive electrode that has an output for generating an output voltage. It should be appreciated that the electrodes may be arranged in various configurations for generating the capacitive field as the sense activation field.

In one embodiment, the drive electrode of each proximity sensor is applied with a voltage input as square wave pulses having a charge pulse cycle sufficient to charge the receive electrode to a desired voltage. The receive electrode thereby serves as a measurement electrode. When a user or operator, such as a user's hand or thumb or other fingers, enters a sense activation field associated with one of the sensors, the disturbance caused by the hand or fingers to the activation field is detected and a signal is generated. Each of the signals is processed by a controller to determine whether or not a user input is detected and whether to control the door actuator to control the opening speed of the door at a high, medium or low speed, whether to close the door, whether a keypad input to deploy the handle or lock or unlock the door was detected, and whether a swipe gesture command to open or close the door was detected, according to various embodiments. The disturbance of each sense activation field is detected by processing a charge pulse signal associated with the corresponding signal channel. When the user's hand or fingers enter the sense activation fields, the disturbance of each sense activation field is processed via separate signal channels.

The sense activation fields 42A-42E generated by each individual proximity sensor is shown in FIGS. 4A-4C slightly overlapping on the first contact surface 30A on the inner side, however, it should be appreciated that the sense activation fields may be smaller or larger and may overlap more or less depending on the sensitivity of the individual sense activation fields. By employing a plurality of sense activation fields on the interior side of the handle 16 in close proximity to the first contact surface 30A, the size and shape of the hand and the amount of gripping contact with the first contact surface 30A may be determined based on the sensed signals. The amplitude of each signal may vary based on the size of the hand and the amount of contact on the first contact surface 30A where the sense activation field is located. Additionally, the amount of contact on the first contact surface 30A extending throughout the entire interior surface of the handle 16 may be determined by processing the signals that are generated with all five capacitive sensors. The sum total of two or more of the five signals or an average value of the signals generated by the capacitive sensors may be processed to determine the contact area on the first contact surface 30A and the user input command. Thus, one or all of the proximity sensors 32A-32E may sense the size of the contact area engaged by a user's hand on the first contact surface 30A.

When an initial contact or close contact of a hand is made with the first contact surface 30A on the inner side 44A of the door handle 16, an initial signal level may be established which may be used to unlatch the door 12, particularly when the user is detected in close proximity to the door with a key fob in possession. According to one embodiment, an initial level is established when the user inputs a door unlatch command. However, the initial signal level may be entered at other contact forces. Once unlatched, the door may be controlled to open with the actuator assist based on a user's input applied by the hand contacting the first contact surface 30A of the door handle 16. The actuator may actuate the door opening at a first speed when a greater first size contact area is sensed relative to the initial contact. The actuator may be controlled to actuate the door opening at a greater second speed when a greater second size contact area is sensed relative to the initial contact. The actuator may further be controlled to actuate the door opening at a third speed when a larger third size contact area is sensed relative to the initial contact. Thus, a user may grab the handle 16 and unlatch the door such that the door is free from the body and may open, and then may proceed to apply a desired amount of force onto the first contact surface 30A by gripping the door handle 16 which flattens the hand and increases the contact area applied to the contact surface 30 on the inner side of the handle. The change in the sensed contact area is used to control the speed of the opening of the door with the actuator. By pulling on the door lightly, the first contact area is achieved, whereas by pulling on the door with a greater amount of force resulting in a greater contact with the contact surface 30 of the handle 16, a greater door opening speed may be achieved. By pulling even harder on the door with a greater force in a further enhanced contact surface may be achieved which causes yet a greater door opening speed. Additionally, by pulling on the door handle repeatedly with at least two pulls, a door input command for closing the door may be determined.

The second contact surface 30B on the outer side 44B of the door handle 16 is made up of individual keypad contacts that serve as keypad inputs for enabling a person to enter a sequence of inputs to deploy the handle to the extended position and to lock and unlock the vehicle doors, according to one embodiment. The use of the keypad to deploy the handle and lock and unlock the door(s) works well when the user does not possess the key fob. The user selectable input keypads are shown arranged horizontally on the driver side door, according to one embodiment. The input pads each define a region upon which a user may touch the input pad with a finger or come in close proximity thereto to enter an input selection. The input pads may each include lighted characters that include backlighting and illustrate numerical characters for a corresponding input entry. The characters may include numerical characters 1 and 2 (1-2) for the first input pad, numerical characters 3 and 4 (3-4) for the second input pad, numerical characters 5 and 6 (5-6) for the third input pad, numerical characters 7 and 8 (7-8) for the fourth input pad and numerical characters 9 and 0 (9-0) for the fifth input pad. It should be appreciated that other characters such as letters or symbols may be employed as input keypad identifiers. Each of the input keypads is aligned with one of the proximity sensors that passes to the second contact surface 30B on the outer side 44B of the handle 16 and senses contact or close proximity, e.g., within 1 millimeter of the user's finger with the corresponding keypad and defines a binary switch output (on or off) indicative of a user's selection of that corresponding input keypad.

The light illumination of each of the characters for the corresponding input pads may be achieved by employing a light source 39, such as one or more LEDs, e.g., RGB LEDs. The light source 39 is in optical communication with a light pipe 40 which extends through openings 38 in the ground layer 37. As such, light generated by the light source 39 illuminates each of the numerical characters on the outer side of the keypad. The light source may generate colored light including red and green light for use as status indicators.

A user may advantageously input a code as a sequence of inputs into the keypads to deploy the handle and to lock and unlock the vehicle door by entering a programmed sequence of input characters (e.g., numbers) via the keypads labeled with the identifier characters. In the locked state, the door latch assembly 22 is locked such that it will not be able to unlatch and open. When the user interacts with the sense activation field extending within one of the keypads, a signal associated with the corresponding proximity sensor is generated. It should be appreciated that the signal generated by the proximity sensors due to interaction with the sensed activation field on the outer surface 44B of the door may have a significantly smaller amplitude due to the reduced size and shape of the corresponding activation fields as compared to a signal generated when a user interacts with the first contact surface 30A on the inner side 44A of the handle 16 with a similar touch event. Accordingly, the controller may also determine a keypad input based on the lower amplitude and the individual activation of one keypad at a time, as opposed to detecting multiple signals sensing an object on the first contact surface 30A when a hand interacts with multiple fields at one time.

A user may advantageously input a gesture command, such as a hand or finger swipe movement from left to right or right to left across the linear array of capacitive sensors as a command to open or close the door 12. The swipe motion may be input when the handle 16 is in either the extended deployed position or the flush stowed position. A swipe motion from left to right may be used as a door open command, whereas a swipe motion from the right to left side may be used as a door close command, according to one embodiment. The swipe motion is detected by detecting a sequential detection of each sensor signal across the linear array within a predetermined time period. The speed of the swipe motion may control the speed of the opening of the door.

Figure 5:
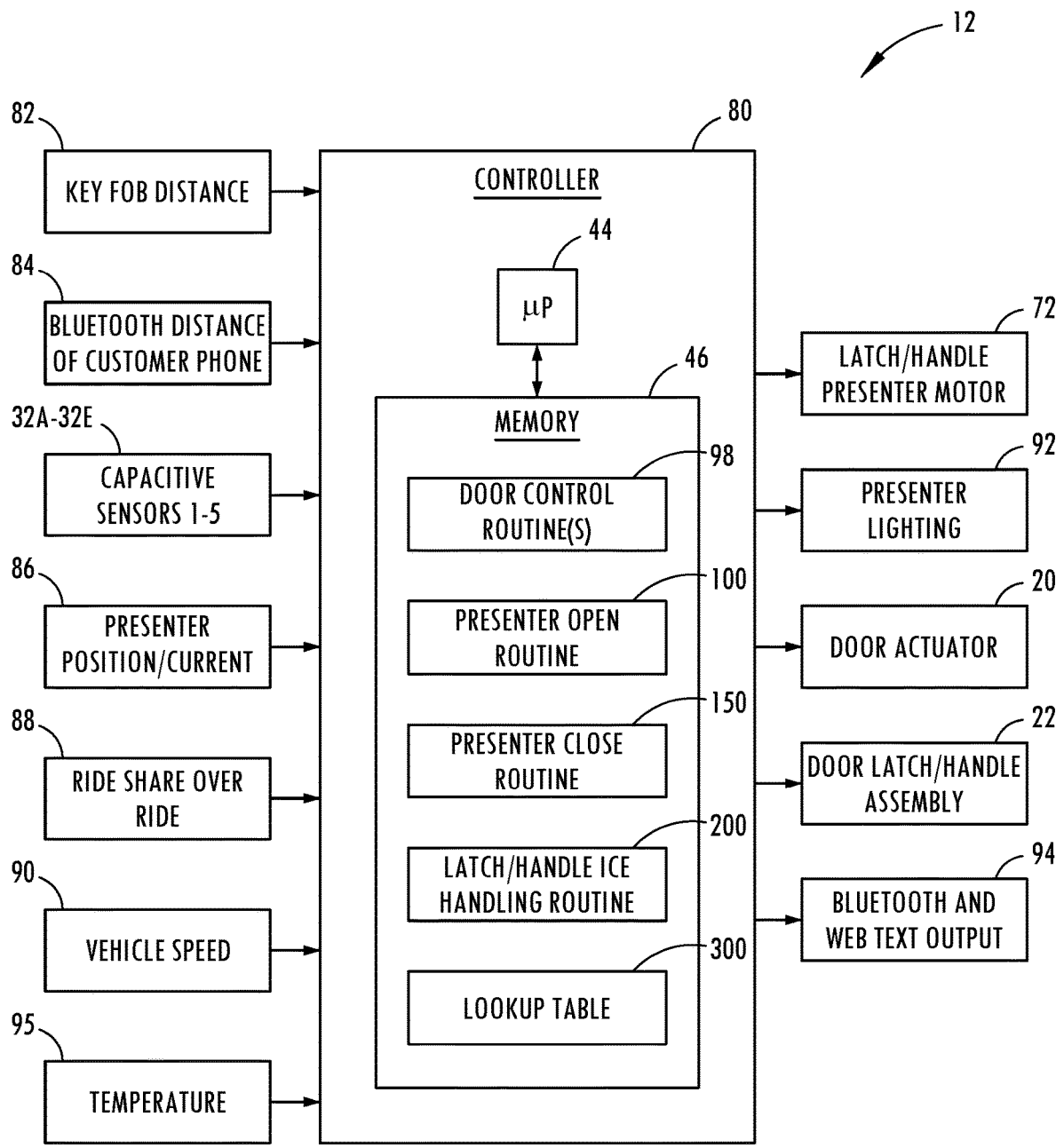
FIG. 5 is a block diagram illustrated controls for processing the proximity sensors associated with the door handle and controlling the door and handle actuators.

Referring to FIG. 5, the controller 80 for determining various user input commands, sensing ice on the handle, and controlling various actuators is illustrated, according to one embodiment. The controller 80 may include a microprocessor 40 and memory 46. It should be appreciated that the controller 80 may include analog and/or digital circuitry. The controller 80 receives signals from each of the capacitive sensors 32A-32E associated with a door handle. The controller 80 may process the signals to determine a keypad input such as a touch input, a gripping or pulling input, a swipe motion or other gesture input commands, and may further determine an ice accumulation and thickness of ice accumulation on the handle body. The controller 80 also receives inputs from a key fob 82 and may determine the distance between the key fob and each door. A temperature sensor 95 may input a handle temperature or vehicle exterior temperature to the controller 80. Further, controller 80 may communicate with a Bluetooth enabled device 84, such as a user's phone and may determine the distance between the Bluetooth enabled device and the doors or the vehicle and the relative position of the Bluetooth enabled device. Further, controller 80 receives an indication of the position of the handle motor and motor current at block 86, and may also receive ride share information 88 and vehicle speed 90. The controller 80 processes the input signals pursuant to one or more control routines such as routines 98, 100, 150 and 200 which may be executed by the microprocessor 44. A lookup table 300 stored in memory 96 may store values for controlling the handle motor to break the detected ice based on the ice thickness and temperature, according to one embodiment.

The controller 80 may control various control devices, such as the handle presenter motor 72 to move the handle between the stowed and extended positions, and the handle lighting device 92 to illuminate the handle body and to control the color of the light. Further, the controller 80 may provide control signals to the door actuator 20 to open and close the door and the speed of opening and closing the door. Further, controller 80 may provide control output signals to the door latch assembly 22 and may output Bluetooth enabled and web text outputs 94.

Figure 6:
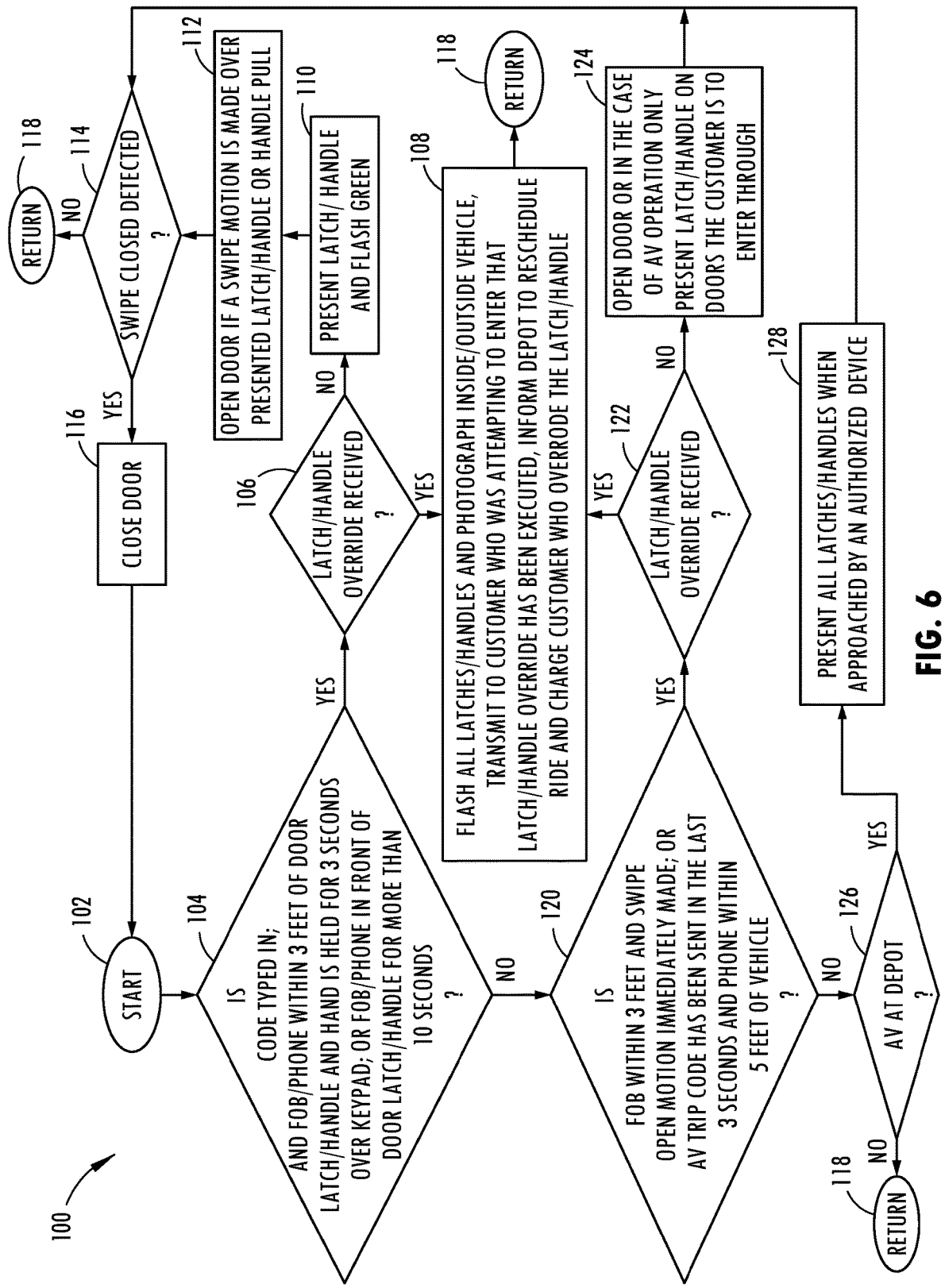
FIG. 6 is a flow diagram illustrating a door handle presenter open routine.

Referring to FIG. 6, the door handle presenter open routine 100 is illustrated, according to one embodiment. Routine 100 begins at step 102 and proceeds to step 104 to determine if a user input code is entered or typed in on the keypad and a key fob or authorized Bluetooth enabled device such as a phone is within three feet of the door handle and a user's hand is held for three seconds over the keypad or if a key fob is in front of the door handle for more than ten seconds and, if so, proceeds to decision step 106 to determine if a latch override is received and, if not, presents the latch handle to the extended deployed position and flashes the handle light with green light at step 110. Next, at step 112, routine 100 opens the door if a swipe open gesture command is detected on the outer side of the presented deployed handle or, if a handle pull is detected on the inner side of the handle. Proceeding to decision step 114, routine 100 determines if a swipe closed gesture command is detected and, if not, returns to step 118. If a swipe closed gesture command is detected, routine 100 closes the door at step 116 before returning to step 102.

If the latch override is received in step 106, routine 100 proceeds to step 108 to flash the handle light on all handles and to the photograph to obtain images of the inside and outside of the vehicle and transmits the images to a ride share customer who is attempting to enter that latch override that has been executed, and informs a ride sharing service or depot to reschedule the ride and charge the customer who overrode the latch before returning to step 118.

If in decision step 104, if neither a code is typed in nor a key fob/phone is within three feet of the door handle while a hand is held for three seconds over the keypad, nor a keypad is in front of the door handle for more than ten seconds, routine 100 proceeds to decision step 120. At decision step 120, routine 100 determines if the key fob is within three feet of the door handle and a swipe open gesture command is immediately made, or if an autonomous vehicle (AV) trip code has been sent in the last three seconds while the phone was located within five feet of the vehicle, then routine 100 proceeds to decision step 122 to determine if the latch override has been received. If a latch override has been received, routine 122 proceeds to step 108. If no latch override is received, routine 100 proceeds to step 124 to open the door or, in the case of an autonomous vehicle operation, only present those handles on the doors the customer is to enter through before proceeding to step 114.

If in decision step 120 neither the key fob is within three feet of the door while a swipe open command motion is immediately detected nor an autonomous vehicle trip code has been sent in the last three seconds while the phone was located within five feet of the vehicle, routine 100 proceeds to decision step 126 to determine if the autonomous vehicle is at a depot and, if so, presents all handles extended to the deployed position when approached by an authorized Bluetooth enabled device so that all handles are in the open position before returning to step 114.

Figure 7:
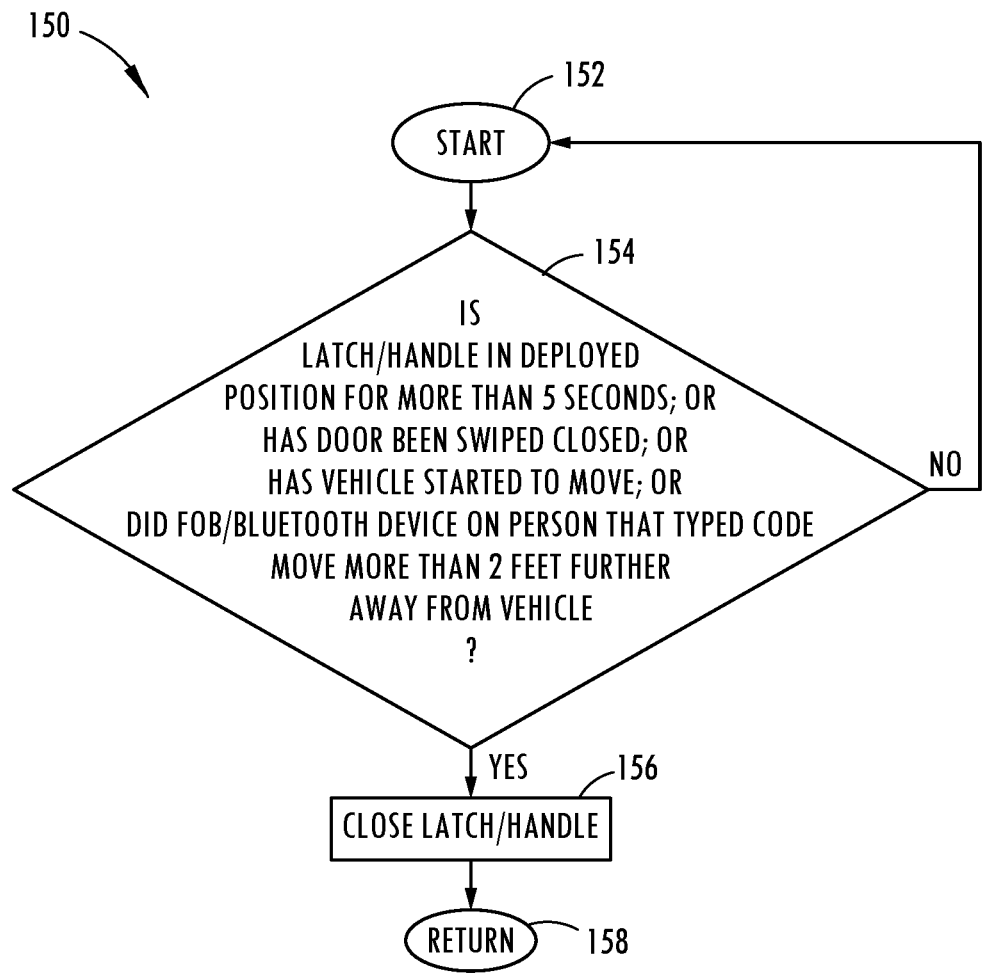
FIG. 7 is a flow diagram illustrating a door handle presenter close routine.

Referring to FIG. 7, a handle presenter close routine 150 is illustrated, according to one embodiment. Routine 150 begins at step 152 and proceeds to step 154 to determine if a handle is in the deployed position for a time period of more than five seconds; or if a door has been swiped with a close gesture command; or if the vehicle has started to move; or if a key fob/Bluetooth enabled device on a person that typed the code moved more than two feet further away from the vehicle and, if so, closes the handle at step 156 before returning at step 158. Otherwise, routine 100 returns to step 152.

The deployable vehicle door handle 16 employs the door actuator in the form of electric motor 72 to deploy and stow the handle body and the door actuator is also used to break ice that forms on the handle body, particularly when the handle body is in the stowed position. Ice formation on the handle body is determined by sensing ice and the thickness of the ice on the handle body with one or more of the capacitive sensors 32A-32E. An average value of the capacitive sensors 32A-32E may be employed to sense the presence of ice and the thickness of the ice, according to one embodiment. According to another embodiment, the largest value of the capacitive sensors may be employed to determine ice and ice thickness. Based on known data, the amplitude of the capacitive signal may be compared to a known range of values indicative of ice formed on the handle and the amplitude within that range may indicate the thickness of the ice. In the event that the ice forms an electrical ground path, a grounded ice condition may be detected base on known values.

When ice formation is detected on the handle body, the handle actuator may be activated in such as a manner as to create a hammering action to break the ice from the handle. The hammering action may be achieved by cycling the electric motor 72 in opposite opening and closing directions. The motor current and torque generated with a pulse width modulation signal input the motor 72 can be controlled to create the hammering action. For a handle actuator having a gear such as the worm gear, the cycling of the motor between opening and closing directions may create backlash within the gear arrangement which may further help to break the ice. Given a high torque motor, the motor may be operated at a 100% pulse width modulation for a limited time period, such as five seconds to create the hammering action with forward and reverse motion using the gear lash to break the ice. This is in comparison to a motor that may otherwise normally operate at 20% pulse width modulation, according to one example. The handle actuator is controlled to create the hammering action to break the ice based on the thickness of the ice detected. For a greater thickness of ice, the motor torque and hammering action are increased to break the ice, whereas, for a lesser ice thickness, the hammering action and torque may be decreased. Thus, the motor may be controlled to break the ice based on the amount of thickness of the ice detected on the handle.

In addition, the motor may be controlled based on the temperature of the handle or other outside temperature that gives an approximate handle temperature, since the strength of ice may vary based on temperature. The temperature of the handle or outside environment may be measured by a vehicle exterior sensor or a temperature sensor located on or near the handle. Generally, the sheer strength of ice increases with lower temperature. As a result, the motor drive current may be increased at a lower temperature. The amount of motor current or torque needed to generate to break the ice may be stored in a lookup table based on ice thickness and temperature and may be employed to control the motor to break the ice. Alternatively, an algorithm may be employed that computes the motor current or torque for a given temperature and ice thickness.

Figure 8A:
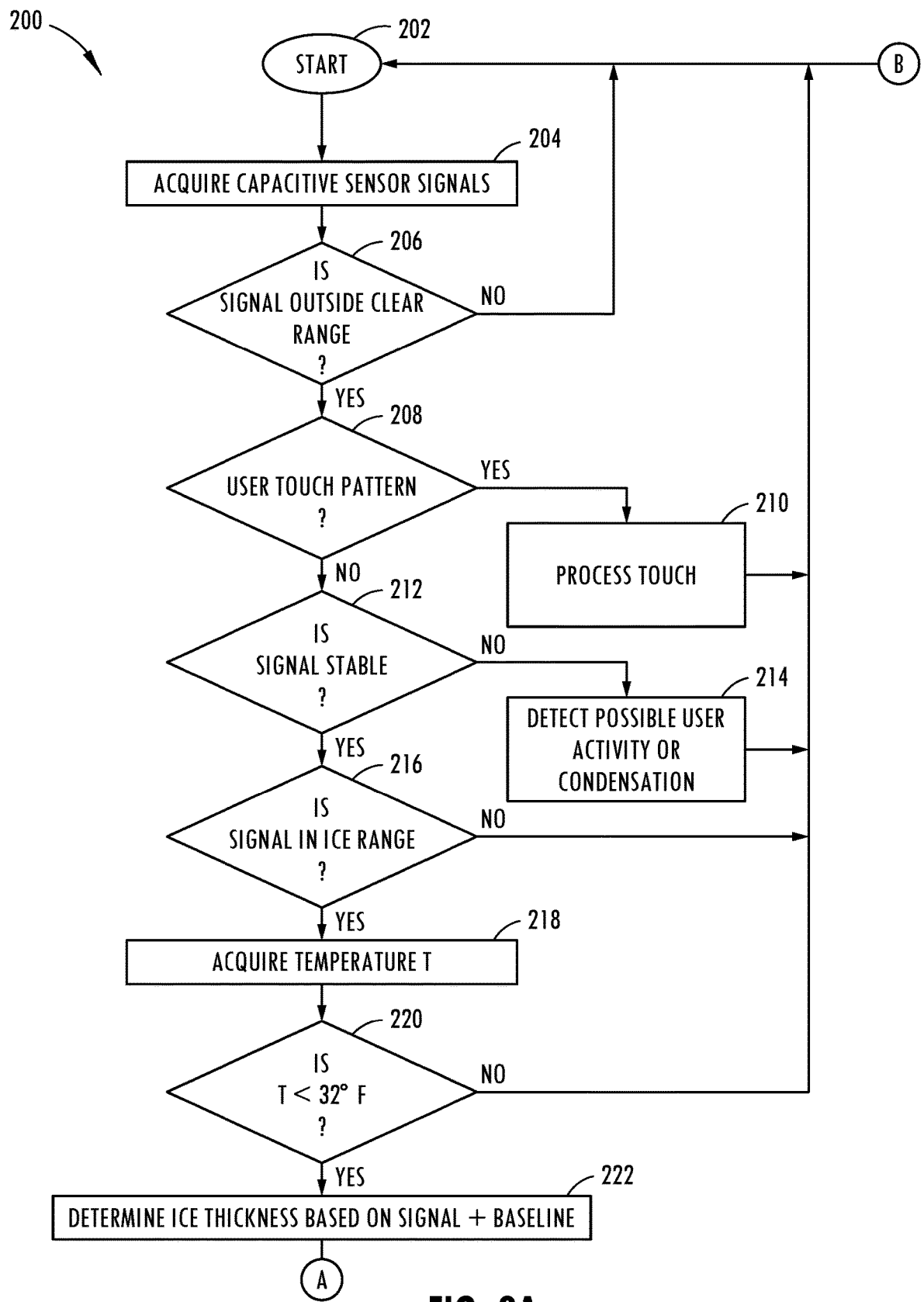
FIG. 8A is a flow diagram illustrating a door handle ice handling routine for sensing and breaking ice.
Figure 8B:
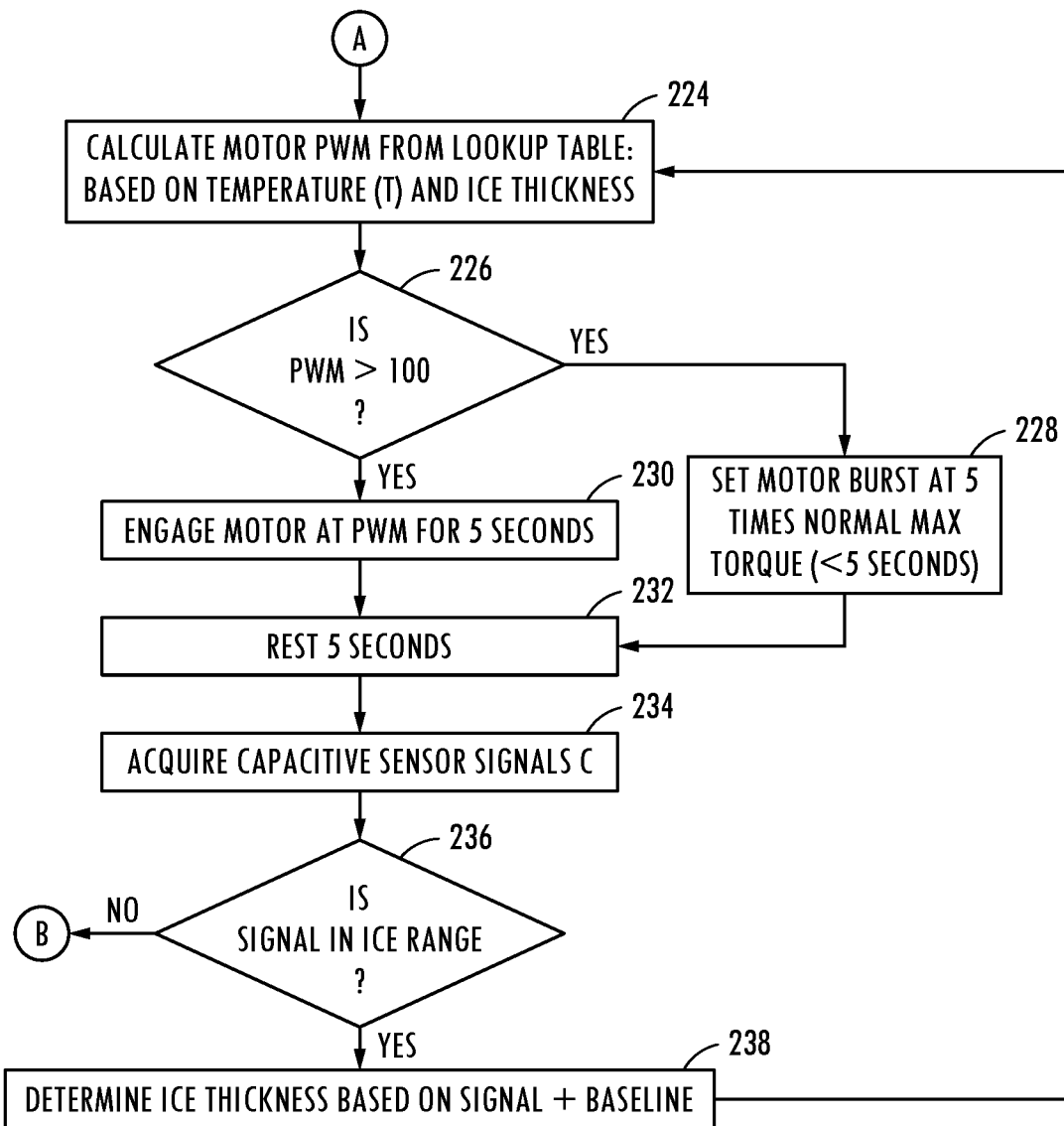
FIG. 8B is a flow diagram further illustrating the door handle ice handling routine of FIG. 8A.

Referring to FIGS. 8A and 8B, the door handle ice handling routine 200 is illustrated, according to one embodiment. Routine 200 begins at step 202 and proceeds to step 204 to acquire one or more of the capacitive sensor signals sensed by the proximity sensors. Next, routine 200 proceeds to decision step 206 to determine if the capacitive sensor signal is outside of a no activity clear range and, if not, returns to step 202. If the capacitive sensor signal is determined to be outside of the no activity clear range, routine 200 proceeds to decision step 208 to determine if a user touch pattern is detected. If a user touch pattern is detected, routine 200 proceeds to step 210 to process a user touch input before returning to step 202. If no user touch pattern is detected, routine 200 proceeds to decision step 212 to determine if the signal is stable and, if not, proceeds to step 214 to detect a possible user activity or condensation condition before returning to step 202. If the signal is stable, routine 200 proceeds to decision step 216 to determine if the signal is detected within an ice range and, if not, returns to step 202. If the signal is within the ice range, routine 200 proceeds to step 218 to acquire the handle temperature, which may include a temperature of the handle as detected by a temperature sensor on or near the handle indicative of the outside handle temperature. Next, at decision step 220, routine 200 determines if the temperature is less than 32° F.

and, if not, returns to step 202. If the temperature is determined to be less than 32° F., routine 200 proceeds to step 222 to determine the thickness of the ice accumulated on the handle based on the capacitive sensor signal and a baseline signal. Next, routine 200 calculates a motor pulse width modulation (PWM) from either a lookup table based on the sensed temperature and ice thickness or from an algorithm that computes the ice thickness based on temperature and ice thickness. Next, at decision step 226, routine 200 determines if the pulse width modulation is greater than a predetermined value such as 100% and, if so, proceeds to step 228 to set the motor burst at about five times the normal maximum torque for a time period of less than five seconds. The increased motor burst creates increased torque in an attempt to break the ice based on the thickness of the ice. If the pulse width modulation is not greater than 100%, routine 200 proceeds to step 230 to activate the motor at a pulse width modulation for five seconds, and then rests the motor for five seconds at step 232 before acquiring the capacitive sensor signals seen at step 234. Next, at decision step 236, routine 200 determines if the signal is within the ice range and, if so, determines the ice thickness based on the signal and the baseline, and then returns to step 224. Otherwise, routine 200 returns to step 202.

Figure 9:
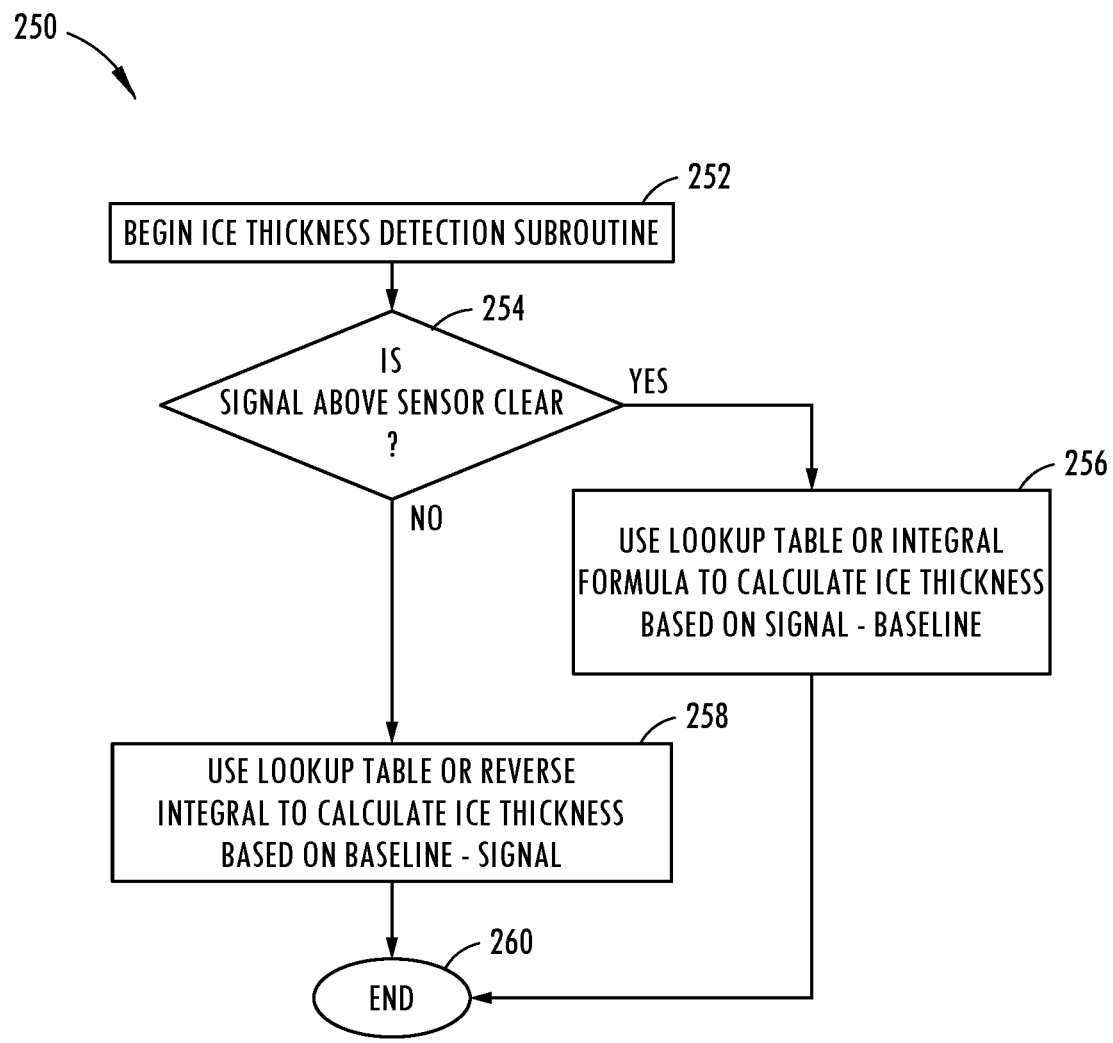
FIG. 9 is a flow diagram illustrating a subroutine for sensing ice thickness on the door handle, according to one embodiment.

Referring to FIG. 9, a subroutine 250 for determine the ice thickness on the handle is illustrated, according to one embodiment. Routine 250 begins at step 252 to begin the ice thickness detection subroutine and then proceeds to decision step 254 to determine if the signal is above a sensor clear value. If the signal is above a sensor clear value, routine 250 proceeds to step 256 to use a lookup table or an integral formula to calculate ice thickness based on the signal minus the baseline. If the signal is not above the sensor clear value, routine 250 proceeds to step 258 to use the lookup table or reverse integral to calculate ice thickness based on the baseline minus the signal value. Routine 250 thereafter ends at step 260. It should be appreciate that subroutine 250 continuously determines the ice thickness for use in the routine 200 to control the motor to break the ice on the handle.

Figure 10:
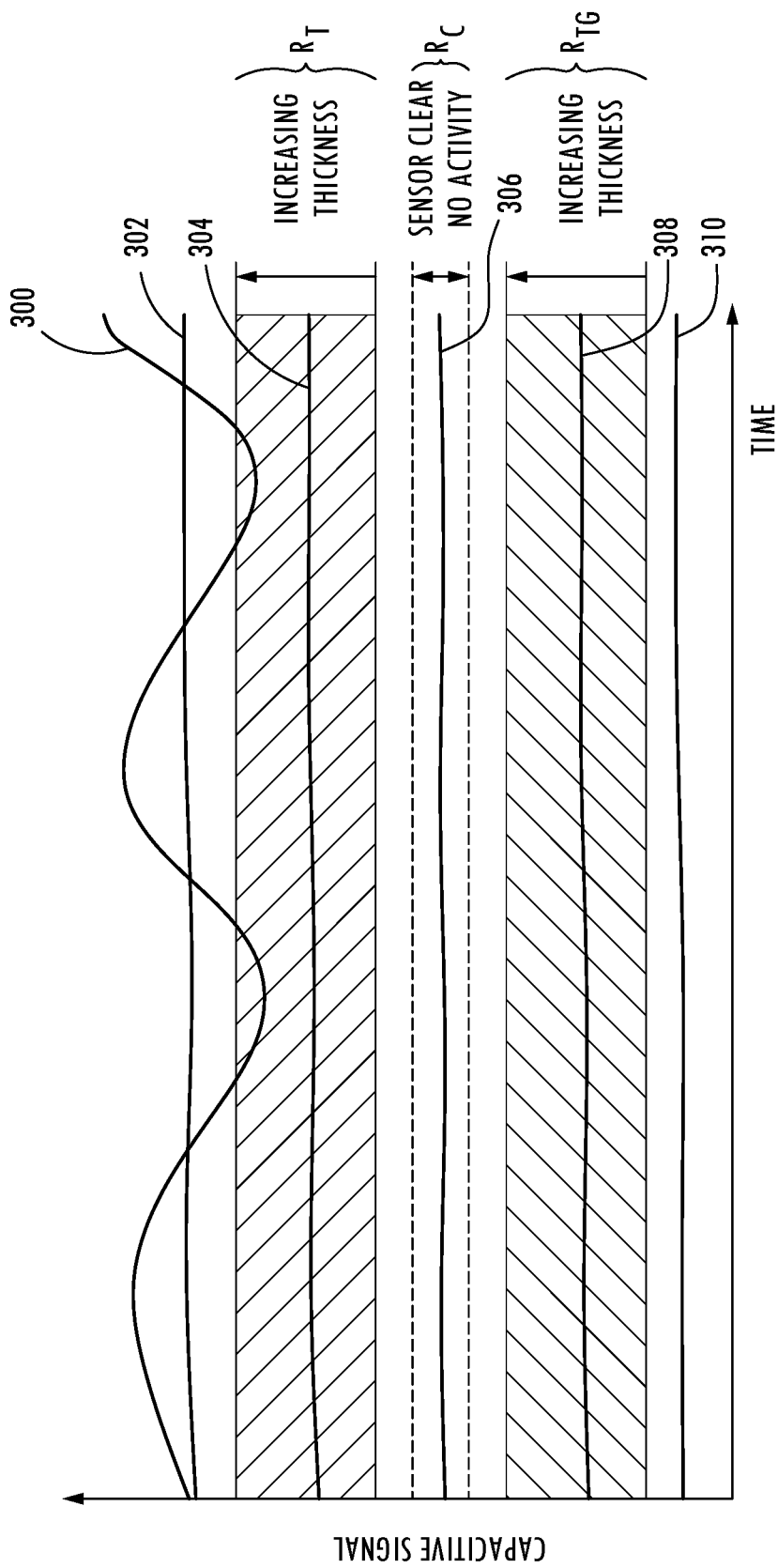
FIG. 10 is a signal diagram illustrating examples of capacitive sensor signals processed to determine presence of ice and ice thickness.

Referring to FIG. 10, examples of capacitive sensor signals are illustrated under various conditions. Signal 300 illustrates a capacitive signal during a rain event which causes variations in the signal amplitude due to the movement of the water flowing on or near the handle. Signal 302 illustrates condensation formed on the handle at a relatively high amplitude. Signal 304 illustrates a stable signal generated with a capacitive sensor when ice is formed on the handle and is not grounding the handle. The amplitude of signal 304 may vary within an ice range RT depending upon the thickness of the ice. The thickness of the ice may be determined with the controller by processing the signal amplitude as described herein. In one embodiment, the thickness of the ice is determined based on the signal amplitude where the signal increases with an increase in ice thickness. The signal 306 indicates a clear handle stable signal when there is no activity on the handle and is shown located within the no activity clear range Rc. Signal 308 illustrates a signal detected when there is ice accumulation on the handle that grounds out the signal. The amplitude of signal 308 may vary within a grounded ice range RTG depending on the thickness of the ice. In this case, the ice creates an electrical ground path that grounds the capacitive signal. Signal 310 illustrates a signal generated when condensation is formed on a handle that is grounded. The controller 80 may advantageously determine the presence of ice and the thickness of the ice on the handle in an ice condition when the signal is within the ice range RT or grounded ice range RTG, and may further determine ice formed on the handle that is grounded by using a lookup table or an algorithm and may control the handle motor 72 based on the sensed thickness of the ice to break the ice.

The controller 80 may monitor the capacitive sensor signal or signals and determine whether there is a formation of ice on the handle based on the signal amplitude within an ice range, such as signal 304 when the ice does not ground the signal or signal 308 when the ice does ground the signal. Based on the amplitude of signal 304 or signal 308, the thickness of the ice may be determined. When the signal is grounded out, the controller 80 may detect a grounded signal such as signal 308 in which the signal grounding affects the capacitive signal. Accordingly, ice may be detected by monitoring the capacitive signal amplitude and ice thickness may be determined when the ice is within an ice range and the ice thickness may be used to control a motor to break the ice.

Accordingly, it should be appreciated that the door handle 16 advantageously employs a deployable handle body with proximity sensors that are used to input gesture commands to control an actuator to deploy the handle. The sensors may be multifunctional and may be used to enter keypad inputs, gesture commands, and door control commands. Additionally, the controller may determine the presence of ice and thickness of ice and may control the actuator to advantageously remove the ice. As a result, the powered door opening assist provides for enhanced door opening functionality.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A vehicle door handle comprising:
    a deployable handle body having an inner side and an outer side;
    an actuator configured to deploy the handle body to a deployed position;
    a plurality of proximity sensors located on the handle body and generating activation fields; and
    a controller processing signals generated by the plurality of sensors to determine an input command and controlling the actuator to deploy the handle based on the input command, wherein the plurality of proximity sensors are configured to as keypads, wherein the controller further determines a keypad input based on the signals generated by the same plurality of sensors, and wherein the controller further determines a handle pull on the inner side of the handle body based on the signals generated by the same plurality of sensors when the handle body is deployed and controls a door actuator to open a door in response to the handle pull.

2. The door handle of claim 1, wherein the keypad input comprises a sequence of inputs sensed by the plurality of sensors used to deploy the handle body.

3. The door handle of claim 2 further comprising a plurality of keypad contact surfaces on an outer side of the handle body.

4. The door handle of claim 1, wherein the controller further determines a swipe gesture command and generates a door command to close or open a door based on the swipe gesture command.

5. The door handle of claim 4, wherein the swipe gesture command is input on the outer side.

6. The door handle of claim 1, wherein the plurality of proximity sensors comprises a plurality of capacitive sensors.

7. The door handle of claim 1, wherein the handle body is flushed mounted in a door in a stowed position and extends outward from a door to an extended deployed position.

8. The door handle of claim 7, wherein the handle body pivots between the stowed and extended deployed positions.

9. A vehicle door handle comprising:
   a deployable handle body located on a door, the handle body having an inner side and an outer side;
   keypad contacts on an outer side of the handle body;
   an actuator configured to deploy the handle to a deployed position;
   a plurality of proximity sensors located on the handle body and generating activation fields; and
   a controller processing signals generated by the plurality of sensors to determine an input command for controlling the actuator and to determine a keypad input, wherein the controller further determines the keypad input based on the signals generated by the same plurality of proximity sensors, wherein the keypad input is entered on the outer side, and wherein the controller further determines a handle pull on the inner side of the handle body based on the signals generated by the same plurality of sensors when the handle body is deployed and controls a door actuator to open the door in response to the handle pull.

10. The door handle of claim 9, wherein the keypad input comprises a sequence of inputs sensed by the plurality of sensors used to deploy the handle body.

11. The door handle of claim 9, wherein the controller further determines a swipe gesture command and closes or opens the door based on the swipe gesture command.

12. The door handle of claim 9, wherein the plurality of proximity sensors comprises a plurality of capacitive sensors.

13. The door handle of claim 9, wherein the handle body is flushed mounted in the door in a stowed position and extends outward from the door to an extended deployed position.

14. The door handle of claim 13, wherein the handle body pivots between the stowed and extended deployed positions.

* * * * *